United States Patent
Lin et al.

(10) Patent No.: US 10,593,709 B2
(45) Date of Patent: Mar. 17, 2020

(54) PANEL DEVICE AND ELECTRONIC DEVICE

(71) Applicant: InnoLux Corporation, Miao-Li County (TW)

(72) Inventors: Hsin-Hung Lin, Miao-Li County (TW); Chin-Chi Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/130,450

(22) Filed: Sep. 13, 2018

(65) Prior Publication Data
US 2019/0109154 A1 Apr. 11, 2019

(30) Foreign Application Priority Data
Oct. 10, 2017 (CN) .......................... 2017 1 0935387

(51) Int. Cl.
*H01L 27/12* (2006.01)
*H01L 27/02* (2006.01)
(Continued)

(52) U.S. Cl.
CPC ............ *H01L 27/124* (2013.01); *H01L 23/60* (2013.01); *H01L 27/0292* (2013.01);
(Continued)

(58) Field of Classification Search
CPC ..................... H01L 23/60; H01L 29/78648
(Continued)

(56) References Cited

U.S. PATENT DOCUMENTS 5,272,586 A * 12/1993 Yen ........................ H02H 9/046
257/356
7,379,127 B2 * 5/2008 Tsao .................. G02F 1/136204
349/40
(Continued)

FOREIGN PATENT DOCUMENTS

| EP | 2 869 338 A1 | 5/2015 |
| JP | H05-142568 A | 6/1993 |
| JP | 2005-136028 A | 5/2005 |

OTHER PUBLICATIONS

European Search Report dated Feb. 20, 2019, issued in application No. EP 18196955.1.

*Primary Examiner* — David Vu
*Assistant Examiner* — Brandon C Fox
(74) *Attorney, Agent, or Firm* — McClure, Qualey & Rodack, LLP

(57) ABSTRACT

A panel device includes a substrate, a common electrode, and an electrostatic protection component. The substrate includes an active area and a peripheral area, the peripheral area is outside of the active area, and a plurality of signal lines is disposed on the substrate. The common electrode is disposed on the substrate, and at least part of the common electrode is disposed in the peripheral area. The electrostatic protection component is disposed in the peripheral area of the substrate and electrically connected to one of the plurality of signal lines and the common electrode, and the electrostatic protection component includes a first double-gate transistor. The first double-gate transistor includes a first gate, a second gate, a first electrode and a second electrode. The first gate is electrically connected to the first electrode, and the second gate is electrically connected to the second electrode.

18 Claims, 9 Drawing Sheets

(51) Int. Cl.
*H01L 29/786* (2006.01)
*H01L 27/146* (2006.01)
*H01L 23/60* (2006.01)
*G02F 1/1362* (2006.01)

(52) U.S. Cl.
CPC ...... *H01L 27/0296* (2013.01); *H01L 27/1225* (2013.01); *H01L 27/14614* (2013.01); *H01L 27/14658* (2013.01); *H01L 29/78645* (2013.01); *H01L 29/78648* (2013.01); *G02F 1/136204* (2013.01)

(58) Field of Classification Search
USPC .......................................... 257/355; 361/56
See application file for complete search history.

(56) References Cited

U.S. PATENT DOCUMENTS

| | | | |
|---|---|---|---|
| 9,142,954 B2* | 9/2015 | Huang | H02H 9/04 |
| 2009/0084938 A1 | 4/2009 | Okada | |
| 2012/0032785 A1 | 2/2012 | Kamata | |
| 2013/0188110 A1* | 7/2013 | Miyamoto | H01L 27/1225 |
| | | | 349/46 |
| 2014/0092510 A1* | 4/2014 | Huang | H02H 9/045 |
| | | | 361/56 |
| 2017/0117705 A1* | 4/2017 | Sekine | G09G 3/36 |
| 2019/0067218 A1* | 2/2019 | Lin | H01L 23/60 |
| 2019/0115377 A1* | 4/2019 | Huang | H01L 27/14603 |

\* cited by examiner

PANEL DEVICE AND ELECTRONIC DEVICE

CROSS REFERENCE TO RELATED APPLICATIONS

This application claims the benefit of China Patent Application No. 201710935387.3, filed Oct. 10, 2017, the entirety of which is incorporated by reference herein.

BACKGROUND OF THE DISCLOSURE

Field of the Disclosure

The present disclosure relates to a panel device, and more particularly to a panel device having an electrostatic protecting component.

Description of the Related Art

An panel device is an optoelectronic device capable of transforming electronic signals into a viewable image, so that a viewer can watch the information contained in the electronic signals. Recently, panel devices such as liquid-crystal displays and Organic electroluminescence displays have become very popular. In addition, a sensing panel device for X-ray systems has gradually been developed as well.

Both the display panel device and the sensing panel device include a structure with thin-film transistors (TFT) and a pixel array, and they are affected by static electricity. Therefore, the electrostatic discharge (ESD) components are disposed on the panel device. However, leakage current may be generated as a result of the electrostatic discharge components and the pixel elements being illuminated by visible light or invisible light, and the characteristics of thin-film transistors and the pixel elements may be affected when the leakage current is too large, causing those components to operate abnormally.

Therefore, an important issue that deserves study is the development of a panel device which is different from the conventional technology and which can reduce electrostatic damage or reduce the effect of leakage current on the characteristics of the pixel element.

BRIEF SUMMARY OF THE DISCLOSURE

Accordingly, the disclosure provides a panel device to solve the problems described above.

In some embodiments, the present disclosure provides a panel device that includes a substrate, a common electrode, and an electrostatic protection component. The substrate includes an active area and a peripheral area, the peripheral area is outside of the active area, and a plurality of signal lines is disposed on the substrate. The common electrode is disposed on the substrate, and at least part of the common electrode is disposed in the peripheral area. The electrostatic protection component is disposed in the peripheral area of the substrate and electrically connected to one of the plurality of signal lines and the common electrode, and the electrostatic protection component includes a first double-gate transistor. The first double-gate transistor includes a first gate, a second gate, a first electrode and a second electrode. The first gate is electrically connected to the first electrode, and the second gate is electrically connected to the second electrode.

DETAILED DESCRIPTION OF THE ILLUSTRATIVE EMBODIMENTS

Figure 1:
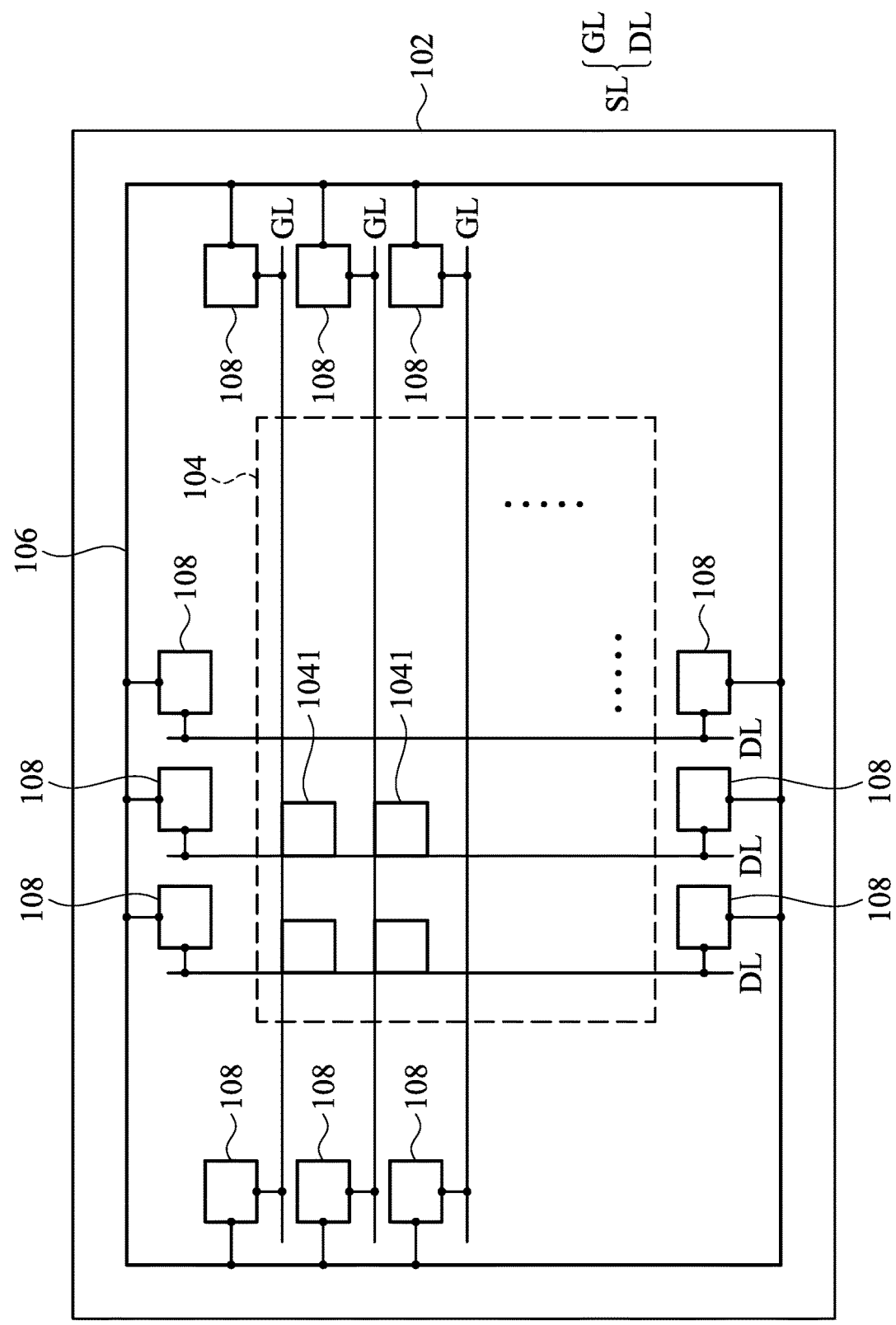
FIG. 1 is a diagram of a panel device according to the first embodiment of the present disclosure.

In the following detailed description, for the purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. The directional terms, such as "up", "down", "left", "right", "front" or "rear", are reference directions for accompanying drawings. Therefore, the use of the directional terms is for description only and is not intended to limit the disclosure.

It should be understood that component for specific description or specific figures can be present in any form with which a skilled person is familiar. In addition, when a layer is "above" other layers or a substrate, it might be "directly" on the layers or the substrate, or some other layers may be between the layer and the other layers.

In this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean+/−20% of the stated value, more typically +/−10% of the stated value and even more typically +/−5% of the stated value. The stated value of the present disclosure is an approximate value. When there is no specific description, the stated value includes the meaning of "about" or "substantially".

Please refer to FIG. 1, which is a diagram of a panel device 100 according to the first embodiment of the present disclosure. In this embodiment, the panel device 100 can be a flat panel display (FPD) device, a flexible panel display device or an X-ray sensing panel device. The panel device 100 can also be a liquid-crystal display (LCD) device, an organic light-emitting diode (OLED) panel device, an inorganic LED panel device (ex. A mini-LED panel device, a micro-LED panel device, or a quantum dot LED panel device), but it is not limited thereto.

As shown in FIG. 1, the panel device 100 includes a substrate 102, an active area 104 composed of a plurality of pixel elements 1041, a peripheral area disposed outside of the active area 104, a plurality of signal lines SL, and a common electrode 106. The electrostatic protection components 108 are disposed in the peripheral area. In one embodiment, the electrostatic protection components 108 also could be disposed in the active area 104, or disposed in the active area 104 and the peripheral area, the plurality of signal lines SL are disposed on the substrate 102, and the common electrode 106 is disposed on the substrate 102 and at least part of the common electrode 106 is disposed in the peripheral area. In the embodiment of the display panel device, the pixel elements 1041 in the active area 104 are configured to display a screen. In the embodiment of the X-ray sensing panel device, the pixel elements 1041 in the active area 104 are configured to sense X-ray information. In addition, the shape of the active area 104 is not limited to that of a rectangle; it can also be a square, circle, oval, polygon or free shape. In some embodiments, the substrate 102 can be a rigid substrate or a flexible substrate, and it may be a transparent substrate or an opaque substrate. The rigid substrate comprises, for example, glass, and the flexible substrate comprises, for example, polyimide (PI) or polyethylene terephthalate (PET), but it is not limited thereto. Any material suitable for the rigid substrate or the flexible substrate is within the scope of the present application. In addition, the plurality of signal lines SL can be data lines DL, scan lines GL, or other control lines in the panel. Any signal line which needs the electrostatic protection is applicable to the electrostatic protection component of the present disclosure. The material of the plurality of signal lines SL can include a conductive material, such as molybdenum metal, molybdenum alloy, aluminum metal, aluminum alloy, IZO, ITO or a suitable conductive material, or any combination thereof. The data line DL is configured to transmit a data signal, and the scan line GL is configured to transmit a scanning signal. Each of the pixel elements 1041 is electrically connected to a corresponding data line DL and a corresponding scan line GL and is configured to receive or reading out the data signal according to the scanning signal.

In the embodiment of the display panel device, the data lines DL transmit data signals into the pixel elements 1041 so as to show a screen image. The X-ray sensing panel device can include a direct-type X-ray sensing panel device and an indirect-type X-ray sensing panel device. In the embodiment of the direct-type X-ray sensing panel device, when an X-ray illuminates the photosensitive layer, the electron-hole pairs are generated directly in the photosensitive layer. Then, the electron-hole pairs are divided by an external bias voltage, so as to be stored in the storage capacitor of the pixel element 1041 in the active area 104, and finally the data signal is reading out through the data line DL. The photosensitive layer of the direct-type X-ray sensing panel device comprises amorphous Selenium (a-Se), Polycrystalline Mercuric Iodide (poly-HgI), Polycrystalline Cadmium Zinc Telluride (poly-CZT), Polycrystalline Lead Iodide (poly-PbI2), or other suitable materials, but it is not limited to this embodiment. In the embodiment of the indirect-type X-ray sensing panel device, when an X-ray illuminates the scintillator layer, the X-ray is transformed into visible light (within the visible spectrum) through the scintillator layer to be received by a sensing element, and the electron-hole pairs are generated in the sensing element. Then, the electron-hole pairs are divided by the external bias voltage to be stored in the capacitor of the sensing element, and finally the data signal is reading out through the data line DL. The scintillator layer comprises $CsI:Tl$, $Gd_2O_2S:Tb$, $CsI:Na$, $NaI:Tl$, $CaWO_4$, $ZnWO_4$, $CdWO_4$, $Bi_4Ge_3O_{12}$, $Lu_{1.8}Yb_{0.2}SiO_5:Ce$, $Gd_2SiO_5:Ce$, or other suitable materials, but it is not limited to this embodiment. In some embodiments, the scintillator layer is disposed on the X-ray sensing panel.

In other embodiments, the common electrode 106 can be selectively extended to be disposed in the active area 104, and at least part of the common electrode 106 is disposed in the peripheral area. Each of the electrostatic protection components 108 is electrically connected to one of plurality of the signal lines SL and the common electrode 106. The electrostatic protection components 108 can selectively disposed on one side of the plurality of the signal lines SL or disposed on two sides of a signal line SL. The common electrode 106 can include a common electrode, a ground electrode or a floating electrode, but it is not limited to this embodiment. Any electrode which serves as the common electrode is within the scope of the present disclosure. Based on displacements of the common electrode 106 and the electrostatic protection components 108, the present disclosure can reduce the problems with electrostatic damage or leakage current of the electrostatic protection component when the electrostatic protection component is illuminated by X-ray irradiation or receives visible light during or after the manufacturing process of the panel device 100.

Figure 2:
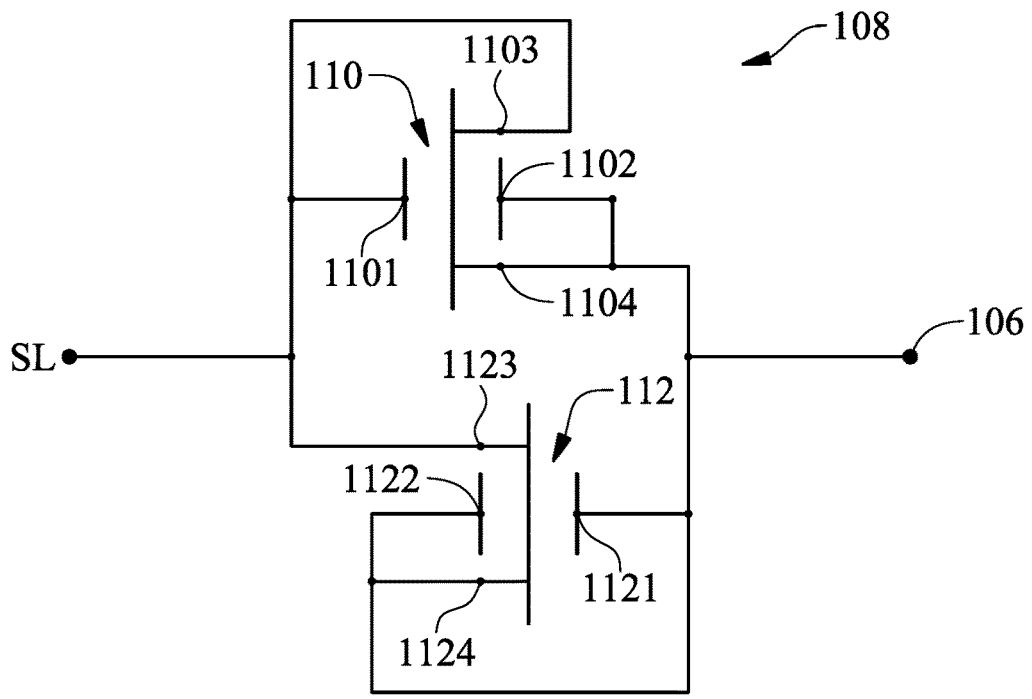
FIG. 2 shows a circuit diagram of an electrostatic protection component according to one embodiment of the present disclosure.

Please refer to FIG. 2, which shows a circuit diagram of an electrostatic protection component 108 according to the first embodiment of the present disclosure. In this embodiment, the electrostatic protection component 108 can include a first double-gate transistor 110 and a second double-gate transistor 112 which are electrically connected to each other. In this embodiment, the first double-gate transistor 110 includes a first gate 1101, a second gate 1102, a first electrode 1103 and a second electrode 1104. The second double-gate transistor 112 includes a third gate 1121, a fourth gate 1122, a third electrode 1123 and a fourth electrode 1124. In this embodiment, the second gate 1102 is disposed at an opposite side of the first gate 1101, and the fourth gate 1122 is disposed at an opposite side of the third gate 1121.

As shown in FIG. 2, the first gate 1101 and the first electrode 1103 are electrically connected to the signal line SL (such as the data line DL, the scan line GL, or another control line). Furthermore, the second gate 1102 and the second electrode 1104 are electrically connected to the common electrode 106. In addition, the third gate 1121 and the fourth electrode 1124 are electrically connected to the common electrode 106. The fourth gate 1122 is electrically connected to the fourth electrode 1124, and the third electrode 1123 is electrically connected to the signal line SL.

Figure 3:
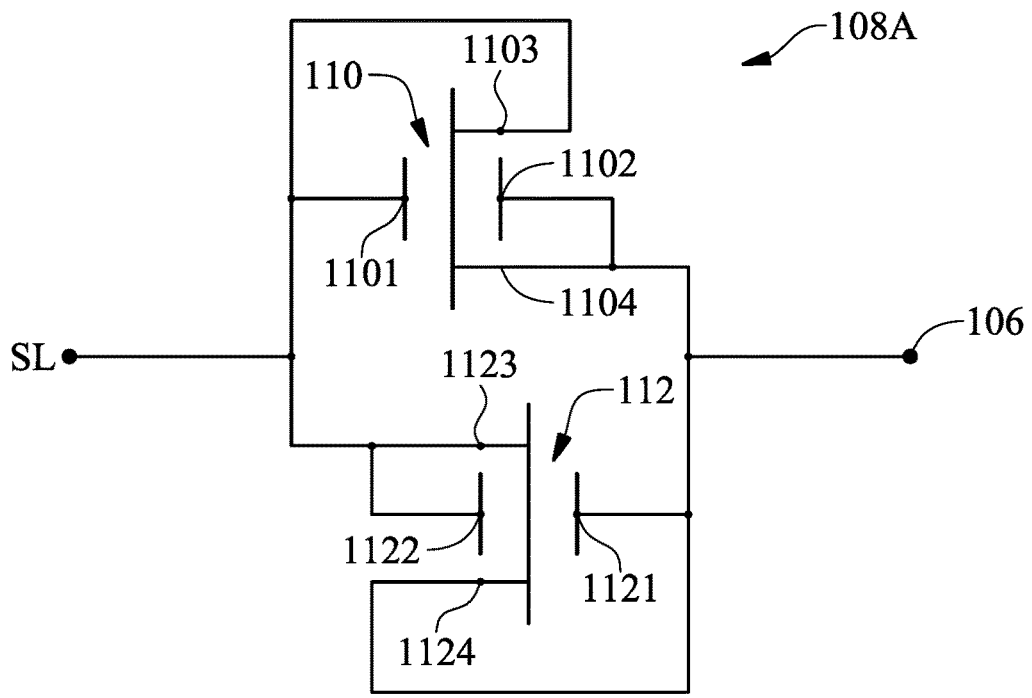
FIG. 3 shows a circuit diagram of an electrostatic protection component according to one embodiment of the present disclosure.

Please refer to FIG. 3, which shows a circuit diagram of an electrostatic protection component 108A according to the second embodiment of the present disclosure. In contrast to the first embodiment, the main difference between the electrostatic protection component 108 and the electrostatic protection component 108A is the configuration of the electrical connection of the second double-gate transistor in this embodiment. In this embodiment, the third gate 1121 and the fourth electrode 1124 are electrically connected to the common electrode 106, and the fourth gate 1122 and the third electrode 1123 are electrically connected to the signal line SL.

Figure 4:
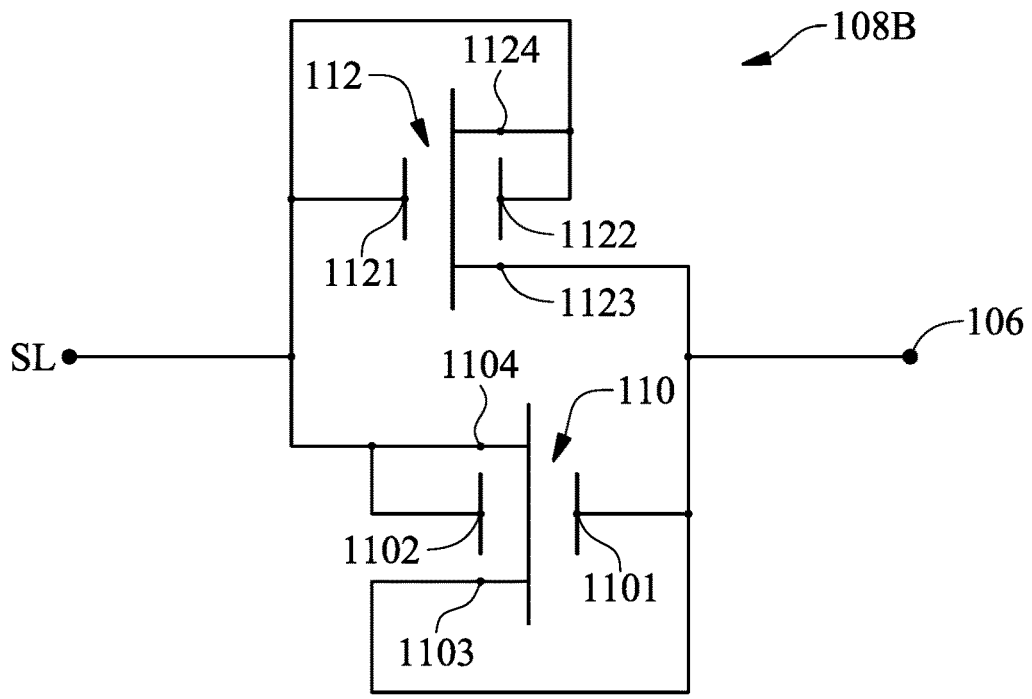
FIG. 4 shows a circuit diagram of an electrostatic protection component according to one embodiment of the present disclosure.

Please refer to FIG. 4, which shows a circuit diagram of an electrostatic protection component 108B according to the third embodiment of the present disclosure. In contrast to the first embodiment, the main difference between the electrostatic protection component 108 and the electrostatic protection component 108B is the configuration of the electrical connection of the second double-gate transistor in this embodiment. In this embodiment, the third gate 1121 and the fourth electrode 1124 are electrically connected to the signal line SL, and the fourth gate 1122 is electrically connected to the fourth electrode 1124. In addition, the third electrode 1123 is electrically connected to the common electrode 106.

Figure 5:
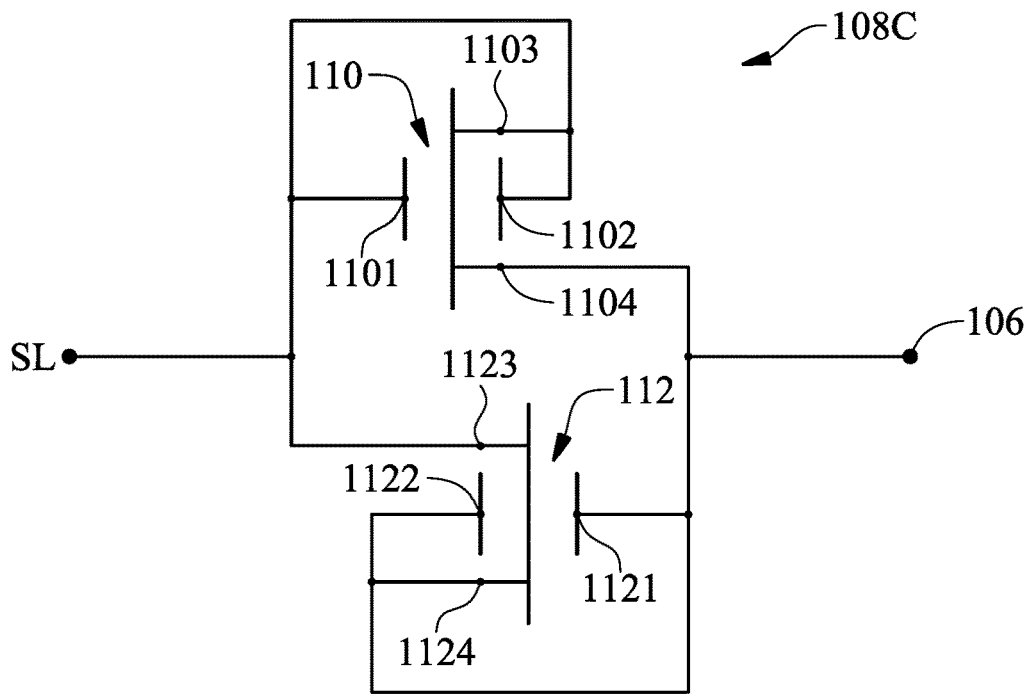
FIG. 5 shows a circuit diagram of an electrostatic protection component according to one embodiment of the present disclosure.

Please refer to FIG. 5, which shows a circuit diagram of an electrostatic protection component 108C according to the fourth embodiment of the disclosure. In contrast to the first embodiment, the main difference between the electrostatic protection component 108 and the electrostatic protection component 108C is the configuration of the electrical connection of the second double-gate transistor in this embodiment. In this embodiment, the third gate 1121 and the fourth electrode 1124 are electrically connected to the common electrode 106, and the fourth gate 1122 is electrically connected to the fourth electrode 1124. In addition, the third electrode 1123 is electrically connected to the signal line SL.

Figure 6:
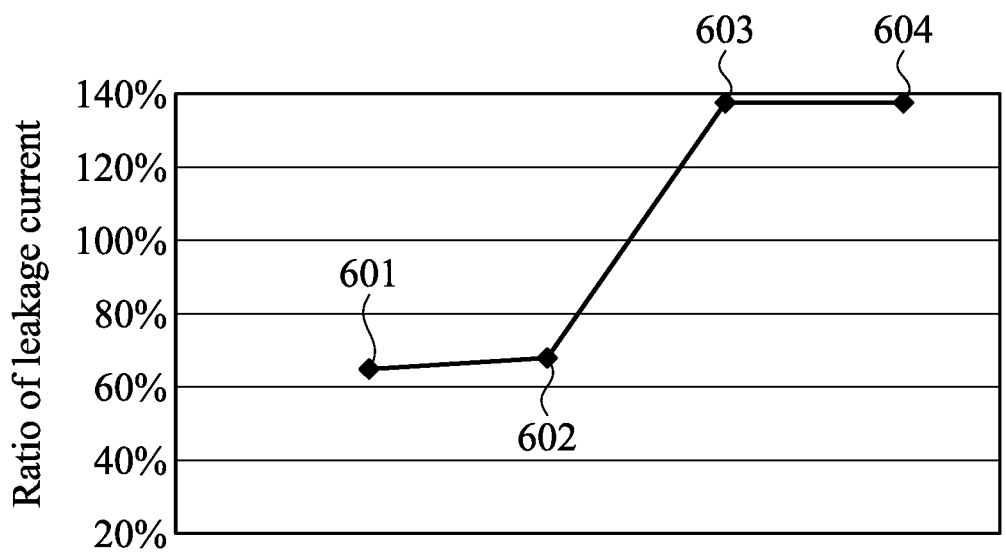
FIG. 6 shows a line chart illustrating the ratios of leakage current when the pixel element is turned on and the leakage current flows from the signal line to the common electrode through the electrostatic protection component according to some embodiments of the present disclosure.
Figure 7:
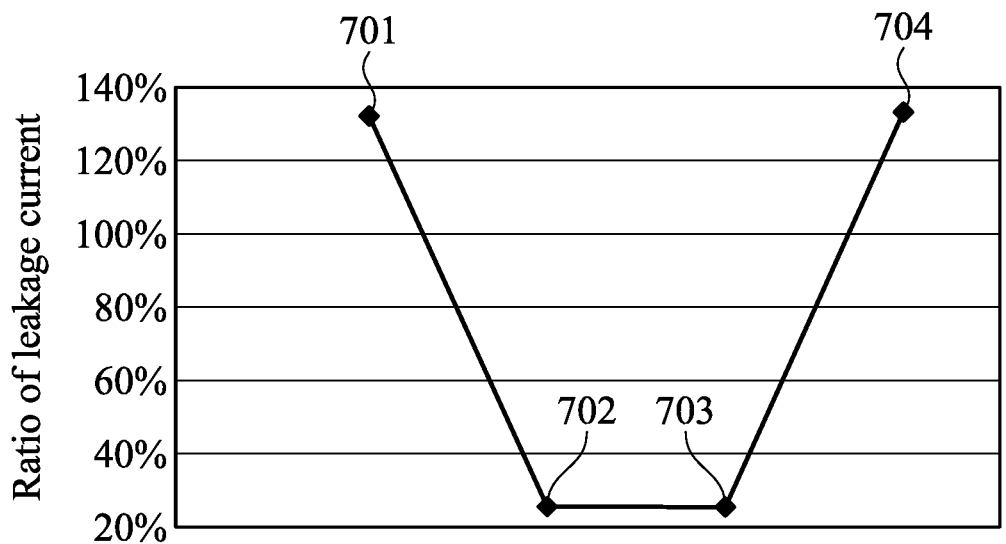
FIG. 7 shows a line chart illustrating the ratios of leakage current when the pixel element is turned off and the leakage current flows from the common electrode to the signal line through the electrostatic protection component according to some embodiments of the present disclosure.

Please refer to FIG. 6 and FIG. 7. FIG. 6 shows a line chart illustrating the ratios of leakage current when the pixel element 1041 is turned on and the leakage current flows from the signal line to the common electrode 106 through the electrostatic protection component according to some embodiments of the present disclosure. FIG. 7 shows a line chart illustrating the ratios of leakage current when the pixel element 1041 is turned off and the leakage current flows from the common electrode 106 to the signal line through the electrostatic protection component according to some embodiments of the present disclosure. As shown in FIG. 6, when the pixel element 1041 is turned on, the reference number 601 indicates the ratio of leakage current of the electrostatic protection component 108 to the conventional electrostatic protection component, the reference number 602 indicates the ratio of leakage current of the electrostatic protection component 108A to the conventional electrostatic protection component, the reference number 603 indicates the ratio of leakage current of the electrostatic protection component 108B to the conventional electrostatic protection component, and the reference number 604 indicates the ratio of leakage current of the electrostatic protection component 108C to the conventional electrostatic protection component. As shown in FIG. 7, when the pixel elements 1041 is turned off, the reference number 701 indicates the ratio of leakage current of the electrostatic protection component 108 to the conventional electrostatic protection component, the reference number 702 indicates the ratio of leakage current of the electrostatic protection component 108A to the conventional electrostatic protection component, the reference number 703 indicates the ratio of leakage current of the electrostatic protection component 108B to the conventional electrostatic protection component, and the reference number 704 indicates the ratio of leakage current of the electrostatic protection component 108C to the conventional electrostatic protection component.

When the static electricity is generated during and after the manufacturing process of the panel device 100, the panel device 100 can adopt the configuration of the electrostatic protection component 108 or the electrostatic protection component 108B, so as to guide a large amount of electrostatic charges to the common electrode 106 and the one of plurality of signal lines SL (such as the data lines DL, the scan lines GL, or other control lines) through the electrostatic protection component. Because the common electrode 106 and the data lines DL (or scan lines GL) share the large amount of electrostatic charges, the electrostatic damage to the panel device 100 can be prevented. In addition, it can be well known from FIG. 6 and FIG. 7, based on the configuration of the electrostatic protection component 108A, when the panel device 100 is in operation, the leakage current of the electrostatic protection component 108A between the common electrode 106 and the one of plurality of signal lines SL is less than the conventional electrostatic protection component regardless of whether the pixel element 1041 is turned on or turned off. As a result, the panel device 100 can operate normally without being affected by the electrostatic protection component.

Figure 8:
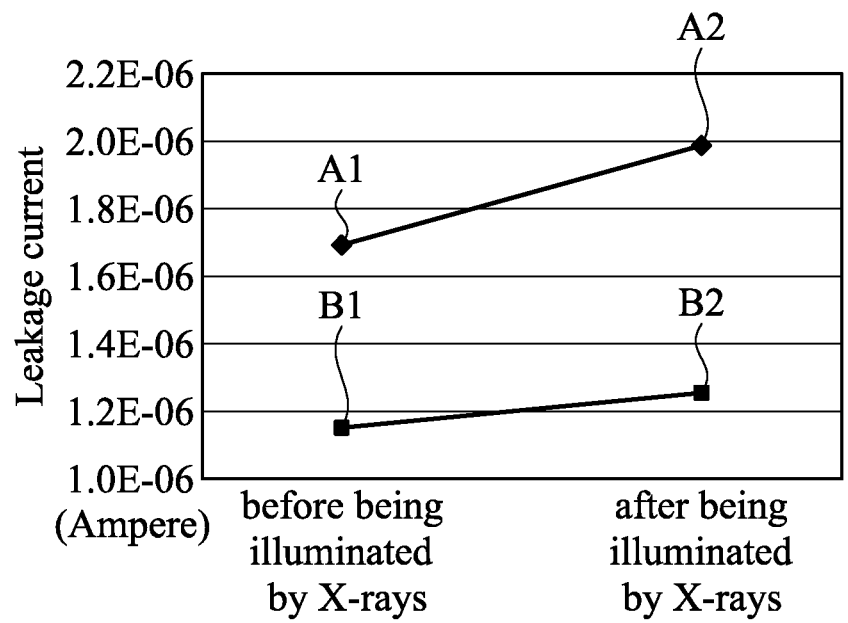
FIG. 8 shows a line chart illustrating the leakage currents of the electrostatic protection component and the conventional electrostatic protection component before and after being illuminated by an X-ray when the pixel element is turned on according to some embodiments of the present disclosure.
Figure 9:
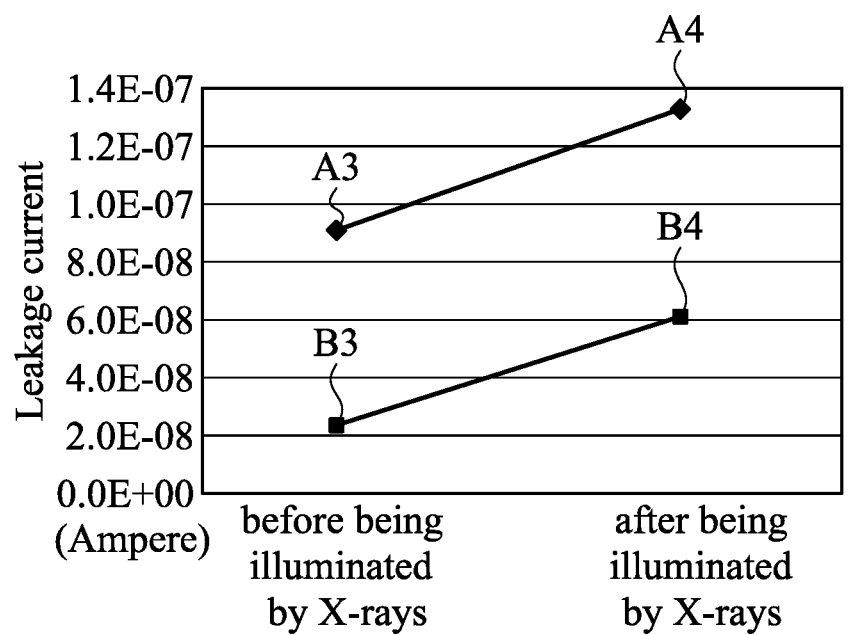
FIG. 9 shows a line chart illustrating the leakage currents of the electrostatic protection component and the conventional electrostatic protection component before and after being illuminated by X-ray when the pixel element is turned off according to some embodiments of the present disclosure.

Please refer to FIG. 8 and FIG. 9. FIG. 8 shows a line chart illustrating the leakage currents of the electrostatic protection component 108A and the conventional electrostatic protection component before and after being illuminated by an X-ray when the pixel element 1041 is turned on according to some embodiments of the present disclosure. FIG. 9 shows a line chart illustrating the leakage currents of the electrostatic protection component 108A and the conventional electrostatic protection component before and after being illuminated by X-ray when the pixel element 1041 is turned off according to some embodiments of the present disclosure. As shown in FIG. 8, the value A1 indicates the leakage current of the conventional electrostatic protection component before being illuminated by the X-ray, the value A2 indicates the leakage current of the conventional electrostatic protection component after being illuminated by the X-ray, the value B1 indicates the leakage current of the electrostatic protection component 108A before being illuminated by the X-ray, and the value B2 indicates the leakage current of the electrostatic protection component 108A after being illuminated by the X-ray. As shown in FIG. 8, both the value B1 and the value B2 are less than the value A1. As shown in FIG. 9, the value A3 indicates the leakage current of the conventional electrostatic protection component before being illuminated by the X-ray, the value A4 indicates the leakage current of the conventional electrostatic protection component after being illuminated by the X-ray, the value B3 indicates the leakage current of the electrostatic protection component 108A before being illuminated by the X-ray, and the value B4 indicates the leakage current of the electrostatic protection component 108A after being illuminated by the X-ray. As shown in FIG. 9, both the value B3 and the value B4 are less than the value A3.

As shown in FIG. 8 and FIG. 9, the leakage current of the electrostatic protection component 108A after being illuminated by an X-ray is still less than the leakage current of the conventional electrostatic protection component before being illuminated by the X-ray. As a result, based on the design of the electrostatic protection component of the present disclosure, the leakage current after being illuminated by the X-ray can be effectively reduced to prevent the large leakage current from causing the pixel element 1041 to operate abnormally.

Figure 10:
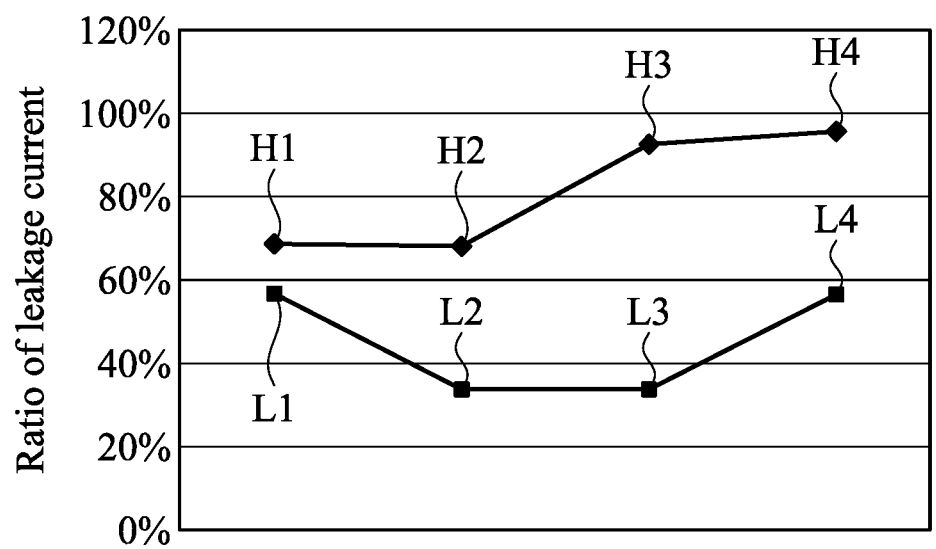
FIG. 10 shows a line chart illustrating the ratios of leakage current of the electrostatic protection component to the conventional electrostatic protection component after the panel device receives visible light according to some embodiments of the present disclosure.

Please refer to FIG. 10, which shows a line chart illustrating the ratios of leakage current of the electrostatic protection component 108 to the conventional electrostatic protection component after the panel device 100 receives visible light according to some embodiments of the present disclosure. As shown in FIG. 10, the reference numbers H1 to H4 respectively indicate the ratios of leakage current of the electrostatic protection component 108, the electrostatic protection component 108A, the electrostatic protection component 108B and the electrostatic protection component 108C to the conventional electrostatic protection component when the pixel element 1041 is turned on. The reference numbers L1 to L4 respectively indicate the ratios of leakage current of the electrostatic protection component 108, the electrostatic protection component 108A, the electrostatic protection component 108B and the electrostatic protection component 108C to the conventional electrostatic protection component when the pixel element 1041 is turned off. It can be known that all of the ratios of the reference numbers H1 to H4 and the reference numbers L1 to L4 are less than 100% as shown in FIG. 10. Therefore, it can be well understood that, based on the design of the electrostatic protection component of the present disclosure, the leakage current of the electrostatic protection component of the present disclosure can be effectively reduced after receiving the visible light, so as to prevent the large leakage current from causing the pixel element 1041 to operate abnormally.

Figure 11:
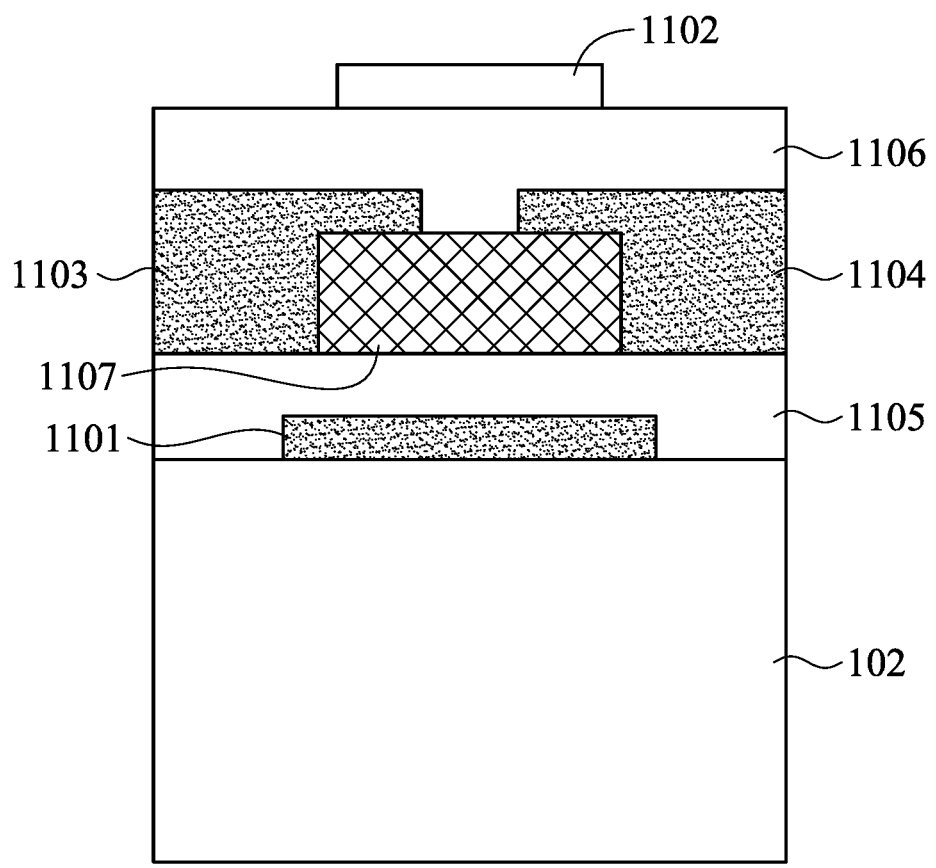
FIG. 11 to FIG. 13 show a structural diagram of the first double-gate transistor according to different embodiments of the present disclosure.
Figure 12:
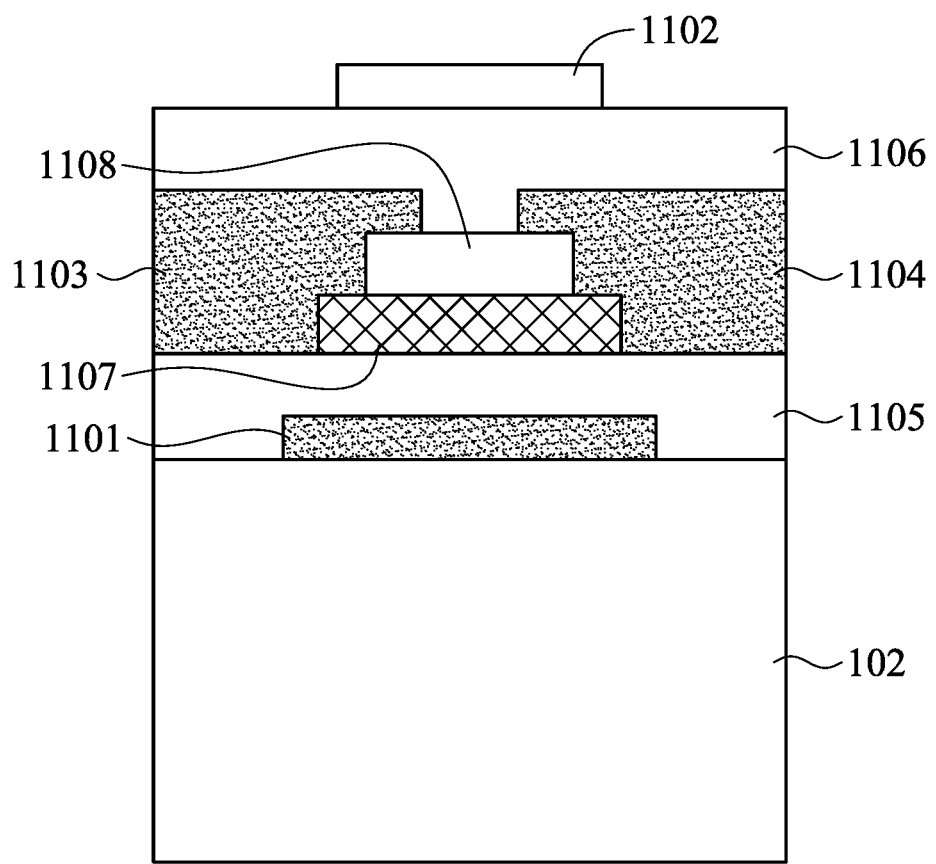
Figure 13:
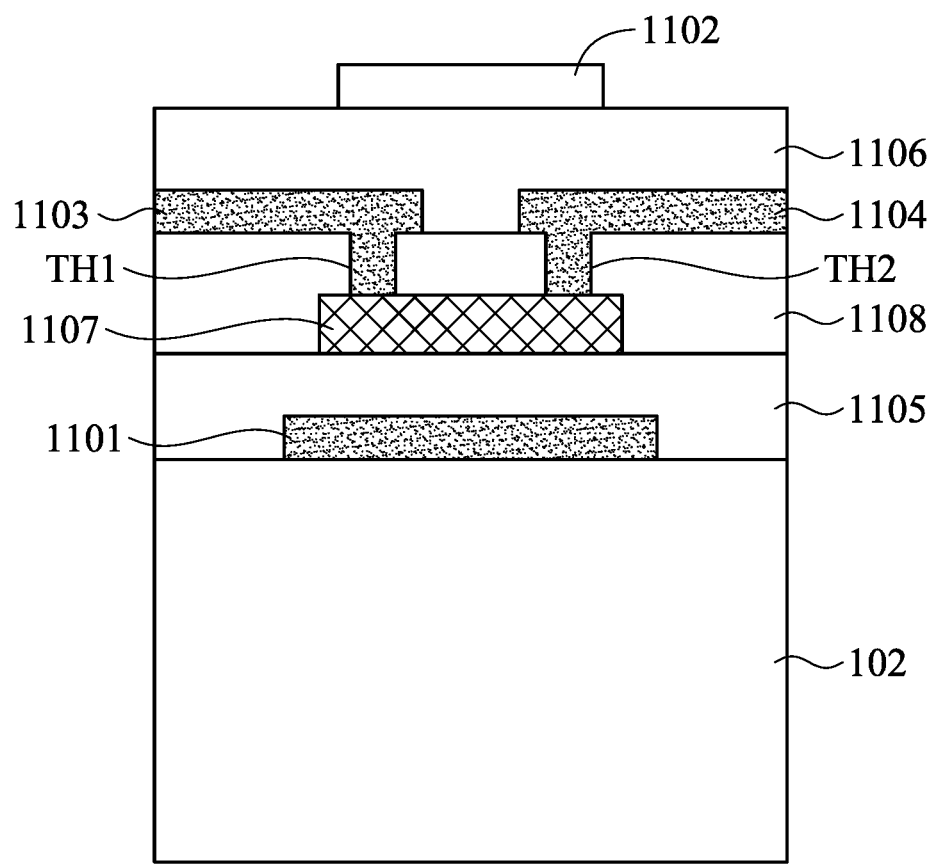

Please refer to FIG. 11 to FIG. 13, which show structural diagrams of the first double-gate transistor 110 according to different embodiments of the present disclosure. It should be noted that some layers are omitted in FIG. 11 to FIG. 13 for clearly illustrating the structure of the transistor. As shown in FIG. 11, the first double-gate transistor 110 further includes a first insulating layer 1105, a second insulating layer 1106 and an active layer 1107. The first gate 1101 is disposed on the substrate 102, the first insulating layer 1105 is disposed on the first gate 1101, the first electrode 1103 and the second electrode 1104 are disposed on the first insulating layer 1105 and electrically connected to the active layer 1107, the second insulating layer 1106 is disposed on the first electrode 1103 and the second electrode 1104, and the second gate 1102 is disposed on the second insulating layer 1106.

As shown in the embodiment of FIG. 12, the first double-gate transistor 110 further includes a third insulating layer 1108. In this embodiment, the first gate 1101 is disposed on the substrate 102, the first insulating layer 1105 is disposed on the first gate 1101, the active layer 1107 is disposed on the first insulating layer 1105, the third insulating layer 1108 is disposed between the active layer 1107 and the second insulating layer 1106, and the first electrode 1103 and the second electrode 1104 are disposed on the first insulating layer 1105 and the third insulating layer 1108 and are in contact with the active layer 1107. The second insulating layer 1106 is disposed on the first electrode 1103 and the second electrode 1104, and the second gate 1102 is disposed on the second insulating layer 1106.

As shown in the embodiment of FIG. 13, the first gate 1101 is disposed on the substrate 102, the first insulating layer 1105 is disposed on the first gate 1101, the active layer 1107 is disposed on the first insulating layer 1105, and the third insulating layer 1108 is disposed on the active layer 1107. The first electrode 1103 and the second electrode 1104 are disposed on the third insulating layer 1108 and are in contact with the active layer 1107 through a first through hole TH1 and a second through hole TH2. The second insulating layer 1106 is disposed on the first electrode 1103 and the second electrode 1104, and the second gate 1102 is disposed on the second insulating layer 1106.

It should be noted that the second gate 1102 and the fourth gate 1122 comprises a conductive material, such as a metal layer or a transparent conductive layer, or another suitable conductive layer. The transparent conductive layer comprises, for example, Tin Oxide, Zinc Oxide, ITO, IZO, ATO, FTO, AZO or any combination thereof, but it is not limited thereto. In addition, the active layer 1107 comprises Indium Gallium Zinc Oxide, Amorphous silicon, Low Temperature Poly-silicon or other suitable material, and the first insulating layer 1105, the second insulating layer 1106 and the third insulating layer 1108 comprises Silicon Oxide, Silicon Nitride or Silicon Oxynitride. Materials of the active layer 1107, the first insulating layer 1105, the second insulating layer 1106 and the third insulating layer 1108 are not limited to this embodiment.

In conclusion, the present disclosure provides a panel device having electrostatic protection components, and the electrostatic protection component includes the first double-gate transistor 110 and the second double-gate transistor 112. The second gate 1102 can be electrically connected to the first electrode 1103 or the second electrode 1104, and the fourth gate 1122 can be electrically connected to the third electrode 1123 or the fourth electrode 1124. Based on the design of the electrostatic protection component of the present disclosure, the leakage current of the electrostatic protection component can be effectively reduced when it is in operation and is illuminated by an X-ray or receives visible light, so as to prevent the large leakage current from causing the pixel element 1041 of the panel device 100 to operate abnormally and to ensure that the panel device 100 operates properly.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A panel device, comprising:
   a substrate, including an active area and a peripheral area, wherein the peripheral area is outside of the active area;
   a plurality of signal lines, disposed on the substrate;
   a common electrode, disposed on the substrate, wherein at least part of the common electrode is disposed in the peripheral area;
   an electrostatic protection component, disposed in the peripheral area of the substrate and electrically connected to one of the plurality of signal lines and the common electrode, and the electrostatic protection component comprising:
   a first double-gate transistor, wherein the first double-gate transistor includes a first gate, a second gate, a first electrode and a second electrode;
   wherein the first gate is electrically connected to the first electrode, and the second gate is electrically connected to the second electrode; and
   a second double-gate transistor, wherein the second double-gate transistor includes a third gate, a fourth gate, a third electrode and a fourth electrode, wherein the second electrode, the third gate and the fourth electrode are electrically connected to the common electrode.

2. The panel device as claimed in claim 1, wherein some of the plurality of signal lines are configured to receive scanning signals.

3. The panel device as claimed in claim 1, wherein some of the plurality of signal lines are configured to receive data signals.

4. The panel device as claimed in claim 1, wherein the fourth gate is electrically connected to the fourth electrode, and the third electrode and the first gate are electrically connected to the one of the plurality of signal lines.

5. The panel device as claimed in claim 1, wherein the first gate, the third electrode and the fourth gate are electrically connected to the one of the plurality of signal lines.

6. The panel device as claimed in claim 1, wherein the fourth gate is electrically connected to the fourth electrode, and the first gate and the third electrode are electrically connected to one of the signal lines.

7. The panel device as claimed in claim 6, wherein the second electrode, the third gate, and the fourth electrode are electrically connected to the common electrode.

8. The panel device as claimed in claim 1, wherein the second gate and the fourth gate are metal layers or transparent conductive layers.

9. The panel device as claimed in claim 1, wherein the first double-gate transistor further comprises a first insulating layer, a second insulating layer and an active layer;
   wherein the first gate is disposed on the substrate, the first insulating layer is disposed on the first gate, the first electrode and the second electrode are disposed on the first insulating layer and electrically connected to the active layer, the second insulating layer is disposed on the first electrode and the second electrode, and the second gate is disposed on the second insulating layer.

10. The panel device as claimed in claim 1, wherein the first double-gate transistor further comprises a first insulating layer, a second insulating layer, a third insulating layer and an active layer;
    wherein the first gate is disposed on the substrate, the first insulating layer is disposed on the first gate, the active layer is disposed on the first insulating layer, the third insulating layer is disposed on the active layer, the first electrode and the second electrode are disposed on the first insulating layer and the third insulating layer and electrically connected to the active layer, the second insulating layer is disposed on the first electrode and the second electrode, and the second gate is disposed on the second insulating layer.

11. The panel device as claimed in claim 1, wherein the first double-gate transistor further comprises a first insulating layer, a second insulating layer, a third insulating layer and an active layer;
    wherein the first gate is disposed on the substrate, the first insulating layer is disposed on the first gate, the active layer is disposed on the first insulating layer, the third insulating layer is disposed on the active layer, the first electrode and the second electrode are disposed on the third insulating layer and electrically connected to the active layer through two through holes, the second insulating layer is disposed on the first electrode and the second electrode, and the second gate is disposed on the second insulating layer.

12. The panel device as claimed in claim 11, wherein the active layer comprises Indium Gallium Zinc Oxide.

13. The panel device as claimed in claim 11, wherein the first insulating layer, the second insulating layer and the third insulating layer comprises Silicon Oxide, Silicon Nitride or Silicon Oxynitride.

14. The panel device as claimed in claim 1, wherein the panel device is a X-ray sensing panel which includes a scintillator layer wherein the scintillator layer is disposed on the X-ray sensing panel.

15. An electronic device, comprising:
    a substrate, including an active area and a peripheral area, wherein the peripheral area is outside of the active area;
    a plurality of signal lines, disposed on the substrate;
    a common electrode, disposed on the substrate, wherein at least part of the common electrode is disposed in the peripheral area;
    an electrostatic protection component, disposed in the peripheral area of the substrate, electrically connected to one of the plurality of signal lines and the common electrode, and the electrostatic protection component comprising:
    a first double-gate transistor, wherein the first double-gate transistor includes a first gate, a second gate, a first electrode and a second electrode;
    wherein the first gate is electrically connected to the first electrode, and the second gate is electrically connected to the second electrode; and
    a second double-gate transistor, wherein the second double-gate transistor includes a third gate, a fourth gate, a third electrode and a fourth electrode, wherein the second electrode, the third gate and the fourth electrode are electrically connected to the common electrode.

16. The electronic device as claimed in claim 15, wherein the first gate, the third electrode and the fourth gate are electrically connected to one of the plurality of signal lines.

17. The electronic device as claimed in claim 15, wherein the fourth gate is electrically connected to the fourth electrode, and the first gate and the third electrode are electrically connected to one of the signal lines.

18. The electronic device as claimed in claim 17, wherein the second electrode, the third gate, and the fourth electrode are electrically connected to the common electrode.

\* \* \* \* \*